(12) United States Patent
Murali (10) Patent No.: US 9,705,664 B2
(45) Date of Patent: Jul. 11, 2017

(54) SYNTHESIZER MODULE, RF TRANSCEIVER AND METHOD THEREFOR

(71) Applicant: MEDIATEK Singapore Pte. Ltd.

(72) Inventor: Nandigam Venkata Murali, Kent (GB)

(73) Assignee: MediaTek Singapore Pte. Ltd., Solaris (SG)

( * ) Notice: Subject to any disclaimer, the term of this patent is extended or adjusted under 35 U.S.C. 154(b) by 0 days.

(21) Appl. No.: 15/176,905

(22) Filed: Jun. 8, 2016

(65) Prior Publication Data

US 2016/0373239 A1  Dec. 22, 2016

Related U.S. Application Data

(60) Provisional application No. 62/181,405, filed on Jun. 18, 2015, provisional application No. 62/254,798, filed on Nov. 13, 2015.

(51) Int. Cl.
*H04B 1/38* (2015.01)
*H04L 7/00* (2006.01)
*H04B 1/40* (2015.01)
*H03K 23/50* (2006.01)

(52) U.S. Cl.
CPC ......... *H04L 7/0037* (2013.01); *H03K 23/507* (2013.01); *H04B 1/40* (2013.01)

(58) Field of Classification Search
CPC ....... G06F 1/08; G11C 11/4076; G11C 7/222; H03K 23/42

USPC ................ 375/219; 365/194, 233.1, 233.11; 327/115, 291
See application file for complete search history.

(56) References Cited

U.S. PATENT DOCUMENTS

| | | | |
|---|---|---|---|
| 6,249,157 B1 * | 6/2001 | Nakura | H03K 23/54 327/115 |
| 7,227,393 B1 * | 6/2007 | Savoj | H03L 7/0812 327/147 |
| 7,272,620 B1 | 9/2007 | Molnar et al. | |
| 7,590,879 B1 * | 9/2009 | Kim | G06F 13/4243 713/400 |
| 7,825,703 B2 | 11/2010 | Qiao et al. | |

* cited by examiner

*Primary Examiner* — Leila Malek
(74) *Attorney, Agent, or Firm* — Optimus Patents US, LLC (57) ABSTRACT

A synthesizer module arranged to generate a timing signal. The synthesizer module comprises an odd-numbered frequency divider circuit arranged to receive a reference timing signal and to output at least one frequency-divided signal having a frequency equal to 1/M times the frequency of the reference timing signal, where M is an odd-numbered integer. A 90° phase-shift component is arranged to receive the reference timing signal and to output a 90° phase-shifted form of the reference timing signal. A re-timing circuit is arranged to re-time a set of transitions of the frequency-divided signal to be temporally aligned to transitions of the 90° phase-shifted form of the reference timing signal to generate the timing signal comprising the re-timed transitions of the frequency-divided signal.

20 Claims, 7 Drawing Sheets

SYNTHESIZER MODULE, RF TRANSCEIVER AND METHOD THEREFOR

FIELD OF THE INVENTION

The field of this invention relates to a synthesizer module and method therefor of generating a timing signal from a reference timing signal. The invention is applicable to, but not limited to, a synthesizer module for use within a radio frequency transceiver.

BACKGROUND OF THE INVENTION

Figure 1:
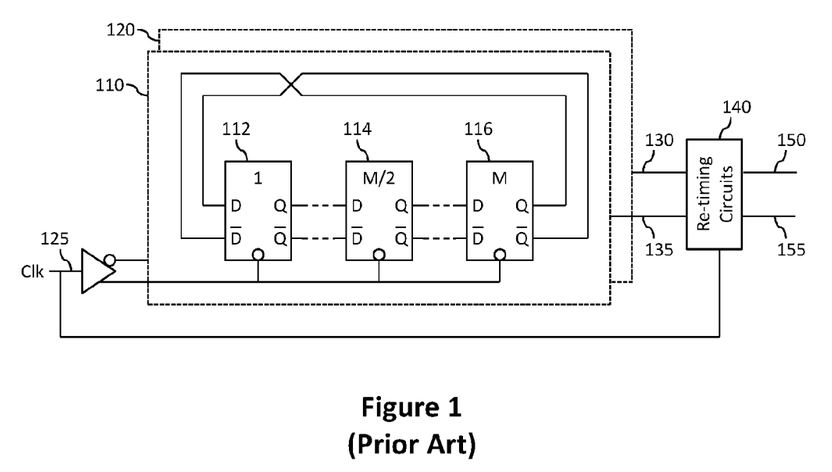
FIG. 1 illustrates an example of a conventional synthesizer.

In the field of radio frequency (RF) transceivers, even-numbered frequency dividers are used within synthesizers to generate quadrature (I/Q) local oscillator (LO) signals. FIG. 1 illustrates an example of such a conventional synthesizer 100. The synthesizer 100 consists of one or more 1/M frequency divider circuits 110, 120. Each frequency divider circuit 110, 120 comprises M flip-flops 112, 114, 116 coupled in a loop whereby the outputs of each flip-flop 112, 114, 116 are coupled to respective inputs of the next flip-flop in the loop, with the exception of the $M^{th}$ flip-flop 116 whose outputs are inversely coupled to the inputs of the first flip-flop 112 such that the non-inverted output of the $M^{th}$ flip-flop 116 is coupled to the inverted input of the first flip-flop 112 whilst the inverted output of the $M^{th}$ flip-flop 116 is coupled to the non-inverted input of the first flip-flop 112.

A timing signal 125 to be divided is provided to the clock inputs of each of the flip-flops 112, 114, 116. In this manner, a state transition resulting from the inverse coupling of the $M^{th}$ flip-flop 116 to the first flip-flop 112 is shifted along the flip-flop loop by one flip-flop each clock cycle. As a result, each flip-flop output generates an oscillating signal having a frequency equal to 1/M the frequency of the timing signal 125, with the respective signal being phase-shifted relative to the signal of the preceding flip-flop by 180/M.

It is known to use even-numbered frequency dividers to generate quadrature LO signals, since generating the required 90° phase-shifted quadrature signals using an even-numbered frequency divider is relatively straightforward. In an even-numbered frequency divider, M is divisible by two. If M is divisible by two, then 90° phase-shifted signals may simply be obtained from, for example, the $M^{th}$ flip-flop and the $(M^{th}/2)$ flip-flop. For example, in a ½ frequency divider, the signal output by the first flip-flop 112 will be phase-shifted with respect to the $M^{th}$ ($2^{nd}$) flip-flop 116 by 180/2, i.e. by 90°. Thus, the 90° phase-shifted quadrature signals may be obtained from an output of the $2^{nd}$ ($M^{th}$) flip-flop 116 and the $1^{st}$ ($M^{th}/2$) flip-flop 112.

Conversely, if M is not divisible by two (e.g. M=3), a second frequency divider circuit 120 comprising flip-flops arranged to receive timing signal 125 at their clock inputs may be used to generate frequency-divided signals. For example, where M=3, the frequency-divided signals generated by the second frequency divider circuit 120 will have flip flop outputs phase-shifted by 180°/3, i.e. by –60° with respect to one another.

Thus, even-numbered frequency division lends itself to generating 90° phase-shifted signals, and thus it is relatively straightforward to generate quadrature frequency-divided signals using even-numbered frequency divider circuits.

Due to the increased number of frequency bands in cellular telecommunications standards, it is becoming increasingly desirable to be able to utilise odd-numbered division for generating local oscillator signals in order to reduce the required frequency range of the synthesizer circuits. However, unlike for even-numbered frequency division, a 90° phase-shift is not directly achievable with odd-numbered frequency division. For example, where M=3, the flip-flop generated signals will be phase-shifted with respect to one another by 180°/3, i.e. by 60°.

Thus, a need exists for an improved odd-numbered frequency divider circuit and method of operation therefor from which 90° phase-shifted quadrature signals are able to be generated.

SUMMARY OF THE INVENTION

Accordingly, the invention seeks to mitigate, alleviate or eliminate one or more of the above mentioned disadvantages singly or in any combination. Aspects of the invention provide a synthesizer module, a radio frequency transceiver module and a method therefor as described in the appended claims.

According to a first aspect of the invention, there is provided a synthesizer module arranged to generate at least one timing signal. The synthesizer module comprises at least one odd-numbered frequency divider circuit arranged to receive a reference timing signal and to output at least one frequency-divided signal having a frequency equal to 1/M times the frequency of the reference timing signal, where M is an odd-numbered integer, a 90° phase-shift component arranged to receive the reference timing signal and to output a 90° phase-shifted form of the reference timing signal, and a re-timing circuit. The re-timing circuit is arranged to receive the at least one frequency-divided signal, receive the 90° phase-shifted form of the reference timing signal, and re-time a set of transitions of the frequency-divided signal to be temporally aligned to transitions of the 90° phase-shifted form of the reference timing signal to generate the at least one timing signal comprising the re-timed transitions of the frequency-divided signal.

Advantageously, and as described in greater detail below, by utilising the re-timing circuit to re-time transitions of the odd-numbered frequency-divided signal to be temporally aligned to transitions of the 90° phase-shifted form of the reference timing signal in this manner, 90° phase-shifted odd-numbered frequency-divided signals may be generated.

According to some optional embodiments, the synthesizer module may be arranged to generate a first timing signal and at least one further timing signal wherein:

- the at least one odd-numbered frequency divider circuit may be arranged to output a first frequency-divided signal having a frequency equal to 1/M times the frequency of the reference timing signal, and the synthesizer module may be arranged to generate the first timing signal based at least partly on transitions within the first frequency-divided signal;
- the at least one odd-numbered frequency divider circuit may be further arranged to output a second frequency-divided signal having a frequency equal to 1/M times the frequency of the reference timing signal and phase-shifted with respect to the first frequency-divided signal; and
- the re-timing circuit may be arranged to receive the second frequency-divided signal and to re-time a set of transitions of the second frequency-divided signal to be temporally aligned to transitions of the 90° phase-shifted form of the reference timing signal, and to generate the at least one further timing signal comprising the re-timed transitions of the second frequency-divided signal temporally aligned to transitions of the 90° phase-shifted form of the reference timing signal.

According to some optional embodiments, the at least one odd-numbered frequency divider circuit may be further arranged to output the second frequency-divided signal phase-shifted by an amount Φ with respect to the first frequency-divided signal, and the re-timing circuit may be arranged to re-time the set of transitions of the second frequency-divided signal to be temporally aligned to transitions of the 90° phase-shifted form of the reference timing signal such that the set of transitions of the at least one further timing signal are phase shifted by an amount Δ with respect to the set of transitions of the second frequency-shifted signal, where Δ=90°−Φ such that the set of transitions of the at least one further timing signal are phase shifted by 90° with respect to the set of transitions of the first timing signal.

According to some optional embodiments, the re-timing circuit may be arranged to re-time leading transitions and trailing transitions of the second frequency-divided signal to be temporally aligned to transitions of the 90° phase-shifted form of the reference timing signal to generate the at least one further timing signal such that the leading transitions and the trailing transitions of the at least one further timing signal are phase shifted by 90° with respect to leading transitions and trailing transitions of the first timing signal.

According to some optional embodiments, the synthesizer module may be arranged to generate a first timing signal and at least one further timing signal, wherein the re-timing circuit is arranged to:
  receive the at least one frequency-divided signal output by the odd-numbered frequency divider circuit;
  receive the reference timing signal;
  receive the 90° phase-shifted form of the reference timing signal;
  re-time a first set of transitions of the at least one frequency-divided signal to be temporally aligned to transitions of the reference timing signal and re-time a second set of transitions of the at least one frequency-divided signal to be temporally aligned to transitions of the 90° phase-shifted form of the reference timing signal to generate the first timing signal; and
  re-time a third set of transitions of the at least one frequency-divided signal to be temporally aligned to transitions of the reference timing signal and re-time a fourth set of transitions of the at least one frequency-divided signal to be temporally aligned to transitions of the 90° phase-shifted form of the reference timing signal to generate the second timing signal.

According to some optional embodiments, the re-timing circuit may comprise a first re-timing component arranged to receive a first frequency-divided signal, receive a second frequency-divided signal, re-time transitions of the first frequency-divided signal to be temporally aligned to transitions of the reference timing signal, re-time transitions of the second frequency-divided signal to be temporally aligned to transitions of the 90° phase-shifted form of the reference timing signal, and
generate the first timing signal comprising the re-timed transitions of the first and second frequency-divided signals. The re-timing circuit may further comprise a second re-timing component arranged to receive an inverted form of the first frequency-divided signal, receive the second frequency-divided signal, re-time transitions of the inverted form of the first frequency-divided signal to be temporally aligned to transitions of the 90° phase-shifted form of the reference timing signal, re-time transitions of the second frequency-divided signal to be temporally aligned to transitions of the reference timing signal, and generate the second timing signal comprising the re-timed transitions of the inverted form of the first frequency-divided signal and the second frequency-divided signal.

According to some optional embodiments, the re-timing circuit may be arranged to receive a pair of complementary frequency-divided signals and a further frequency-divided signal output by the odd-numbered frequency divider circuit. The first re-timing component of the re-timing circuit may be arranged to re-time trailing transitions of an inverted signal of the pair of complementary frequency-divided signals to be temporally aligned to transitions of the reference timing signal, re-time leading transitions of the further frequency-divided signal to be temporally aligned to transitions of the 90° phase-shifted form of the reference timing signal, and generate the first timing signal comprising the re-timed transitions of the respective frequency-divided signals. The second re-timing component of the re-timing circuit may be arranged to re-time leading transitions of a non-inverted signal of the pair of complementary frequency-divided signals to be temporally aligned to transitions of the reference timing signal, re-time trailing transitions of the further frequency divided signal to be temporally aligned to transitions of the 90° phase-shifted form of the reference timing signal, and generate the second timing signal comprising the re-timed transitions of the respective frequency-divided signals.

According to some optional embodiments, the first re-timing component of the re-timing circuit may be arranged to generate the first timing signal comprising a frequency equal to 1/M the frequency of the reference timing signal with a 25% duty cycle, and the second re-timing component of the re-timing circuit may be arranged to generate the second timing signal comprising a frequency equal to 1/M the frequency of the reference timing signal with a 25% duty cycle, and phase-shifted by 90° with respect to the first timing signal.

According to a second aspect of the invention, there is provided a radio frequency transceiver module comprising at least one synthesizer module according to the first aspect of the invention.

According to a third aspect of the invention, there is provided a method of generating a timing signal from a reference timing signal, The method comprises generating a 90° phase-shifted form of the reference timing signal, generating at least one frequency-divided signal having a frequency equal to 1/M times the frequency of the reference timing signal, where M is an odd-numbered integer, and re-timing a set of transitions of the frequency-divided signal to be temporally aligned to transitions of the 90° phase-shifted form of the reference timing signal to generate the timing signal comprising the re-timed transitions of the frequency-divided signal.

According to some optional embodiments, the method may comprise:
  generating a first frequency-divided signal having a frequency equal to 1/M times the frequency of the reference timing signal;
  re-timing a set of transitions of the first frequency-divided signal to be temporally aligned to transitions of the reference timing signal;
  generating a first timing signal comprising the re-timed transitions of the first frequency-divided signal temporally aligned to transitions of the reference timing signal;

generating a second frequency-divided signal having a frequency equal to 1/M times the frequency of the reference timing signal and phase-shifted with respect to the first frequency-divided signal;

re-timing at least a set of transitions of the second frequency-divided signal to be temporally aligned to transitions of the 90° phase-shifted form of the reference timing signal; and generating at least one further timing signal comprising the re-timed transitions of the second frequency-divided signal temporally aligned to transitions of the 90° phase-shifted form of the reference timing signal.

According to some optional embodiments, the method may comprise:

generating a pair of complementary frequency-divided signals, generating a further frequency-divided signal;

re-timing trailing transitions of an inverted signal of the pair of complementary frequency-divided signals to be temporally aligned to transitions of the reference timing signal;

re-timing leading transitions of the further frequency-divided signal to be temporally aligned to transitions of the 90° phase-shifted form of the reference timing signal;

generating the first timing signal comprising the re-timed transitions of the respective frequency-divided signals;

re-timing leading transitions of a non-inverted signal of the pair of complementary frequency-divided signals to be temporally aligned to transitions of the reference timing signal;

re-timing trailing transitions of the further frequency divided signal to be temporally aligned to transitions of the 90° phase-shifted form of the reference timing signal; and generating the second timing signal comprising the re-timed transitions of the respective frequency-divided signals.

According to some optional embodiments, the method may comprise generating the first timing signal comprising a frequency equal to 1/M the frequency of the reference timing signal with a 25% duty cycle, and generating the second timing signal comprising a frequency equal to 1/M the frequency of the reference timing signal with a 25% duty cycle, and phase-shifted by 90° with respect to the first timing signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a synthesizer module for use within a radio frequency transceiver module. However, it will be appreciated by a skilled artisan that the inventive concept herein described may be embodied in any type of device requiring the generation of a timing signal.

In accordance with some example embodiments of the invention, there is provided a synthesizer module arranged to generate a timing signal. The synthesizer module comprises an odd-numbered frequency divider circuit arranged to receive a reference timing signal and to output at least one frequency-divided signal having a frequency equal to 1/M times the frequency of the reference timing signal, where M is an odd-numbered integer. A 90° phase-shift component is arranged to receive the reference timing signal and to output a 90° phase-shifted form of the reference timing signal. A re-timing circuit is arranged to re-time a set of transitions of the frequency-divided signal to be temporally aligned to transitions of the 90° phase-shifted form of the reference timing signal to generate the timing signal comprising the re-timed transitions of the frequency-divided signal.

Advantageously, and as described in greater detail below, by utilising the re-timing circuit to re-time transitions of the odd-numbered frequency-divided signal to be temporally aligned to transitions of the 90° phase-shifted form of the reference timing signal in this manner, 90° phase-shifted odd-numbered frequency-divided signals may be generated. As a result, odd-numbered frequency division may be utilised for generating local oscillator signals within radio frequency transceivers, reducing the required frequency range of the synthesizer circuits necessary for achieving the increasing number of frequency bands in cellular telecommunications standards.

Figure 2:
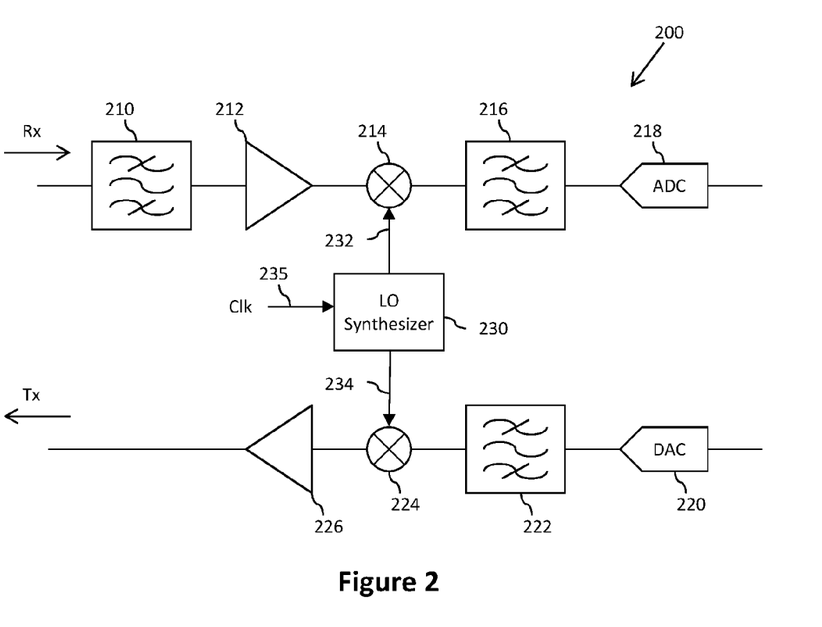
FIG. 2 illustrates a simplified block diagram of a radio frequency (RF) transceiver.

Referring now to FIG. 2, there is illustrated a simplified block diagram of a radio frequency (RF) transceiver 200. The RF transceiver module 200 comprises receive and transmit chains. The part of the receive chain illustrated in FIG. 2 includes a bandpass filter 210 arranged to receive an RF signal from an antenna (not shown), a low-noise amplifier 212, a mixer 214, a further bandpass filter 216 and an analogue to digital converter 218. The part of the transmit chain illustrated in FIG. 2 includes a digital to analogue converter 220, a bandpass filter 222, a mixer 224 and a power amplifier 226 arranged to output an RF signal for transmission to an antenna (not shown). The RF transceiver module 200 further comprises a local oscillator synthesizer module 230 arranged to receive a reference timing signal 235 and to generate therefrom local oscillator (LO) signals 232, 234 used by the mixers 214, 224 to down/up convert the respective receive/transmit signals.

As will be appreciated by a person skilled in the art, the signals within such an RF transceiver module 200 typically comprise quadrature signals consisting of two signal components phase-shifted by 90° with respect to one another. Accordingly, each LO signal 232, 234 comprises a quadrature signal consisting of a first, in-phase (I) component and a second, quadrature (Q) component phase-shifted by 90° with respect to the in-phase component.

As previously stated, due to the increased number of frequency bands in cellular telecommunications standards, it is becoming increasingly desirable to be able to perform odd-numbered division in order to reduce the required frequency range of the synthesizer circuits used to generate local oscillator signals. However, unlike for even-numbered frequency division, a 90° phase-shift is not directly achievable with odd-numbered frequency division.

Figure 3:
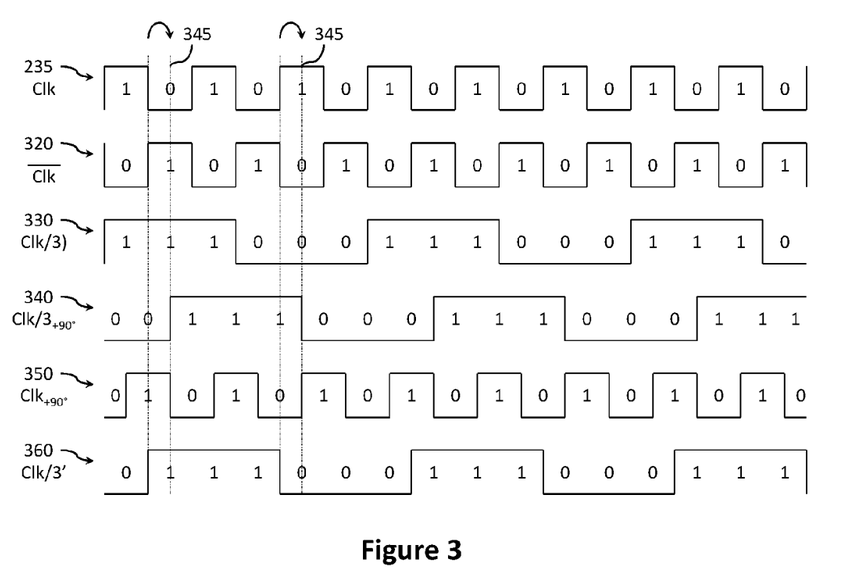
FIG. 3 illustrates a timing diagram showing various timing signals.

Referring now to FIG. 3, there is illustrated a timing diagram showing various timing signals, including a reference timing signal 235 and an inverted reference timing signal 320. The timing diagram of FIG. 3 further includes a ⅓ (i.e. odd-numbered) frequency-divided signal 330 generated from the reference timing signal 235. A 90° phase-shifted version of the ⅓ frequency-divided signal 330 is illustrated at 340. As illustrated in FIG. 3, for odd-numbered frequency-divided signals such as the ⅓ frequency-divided signals 330, 340, phase-shifting the frequency-divided signal by 90° results in the transitions within the phase-shifted signal 340 falling halfway between the transitions of the reference timing signal 235 and inverted reference timing signal 320, as illustrated by the broken lines 345. Accordingly, neither the reference timing signal 235 nor the inverted reference timing signal 320 can be used directly as a timing reference for generating the 90° phase-shifted ⅓ frequency-divided signal 340.

However, the inventors have recognised that a reference timing signal phase shifted by 90°, such as the reference timing signal 350 illustrated in FIG. 3, would provide transitions that coincide with the transitions of the 90° phase-shifted ⅓ frequency-divided signal 340, and thus that may be used to re-time the transitions of a ⅓ frequency-divided signal to generate the 90° phase-shifted ⅓ frequency-divided signals 330, 340.

Accordingly, the inventors propose utilising a 90° phase-shift component arranged to receive a reference timing signal, such as the reference timing signal 235 illustrated in FIGS. 2 and 3, and to generate the 90° phase-shifted form of the reference timing signal, such as the 90° phase-shifted reference timing signal 350 illustrated in FIG. 3. It is further proposed to utilise a re-timing circuit to re-time transitions of an odd-numbered frequency-divided signal having a frequency equal to 1/M times the frequency of the reference timing signal (where M is an odd-numbered integer) to be temporally aligned to transitions of the 90° phase-shifted form of the reference timing signal to generate the timing signal comprising the re-timed transitions of the frequency-divided signal. In this manner, 90° phase-shifted odd-numbered frequency-divided signals may be achieved.

In particular for some example embodiments of the present invention, such as described in greater detail below, there is proposed a synthesizer module arranged to generate a first timing signal and a further timing signal, the further timing signal comprising transitions that are 90° phase-shifted with respect to corresponding transitions within the first timing signal. The synthesizer circuit comprises an odd-numbered frequency divider circuit arranged to output a first frequency-divided signal having a frequency equal to 1/M times the frequency of a reference timing signal, and the synthesizer module is arranged to generate the first timing signal based at least partly on transitions within the first frequency-divided signal. The odd-numbered frequency divider circuit is further arranged to output a second frequency-divided signal having a frequency equal to 1/M times the frequency of the reference timing signal and phase-shifted, for example by an amount Φ, with respect to the first frequency-divided signal. A re-timing circuit may then be utilised to re-time a set of transitions (e.g. comprising leading and/or trailing transitions) of the second frequency-divided signal to be temporally aligned to transitions of the 90° phase-shifted form of the reference timing signal to generate the further timing signal. For example, the re-timing circuit may be arranged to re-time the set of transitions of the second frequency-divided signal to be temporally aligned to transitions of the 90° phase-shifted form of the reference timing signal such that the set of transitions of the further timing signal are phase shifted by an amount Δ with respect to the set transitions of the second frequency-shifted signal, where Δ=90°−Φ such that the set of transitions of the further timing signal are phase shifted by 90° with respect to the set of transitions of the first timing signal.

Figure 4:
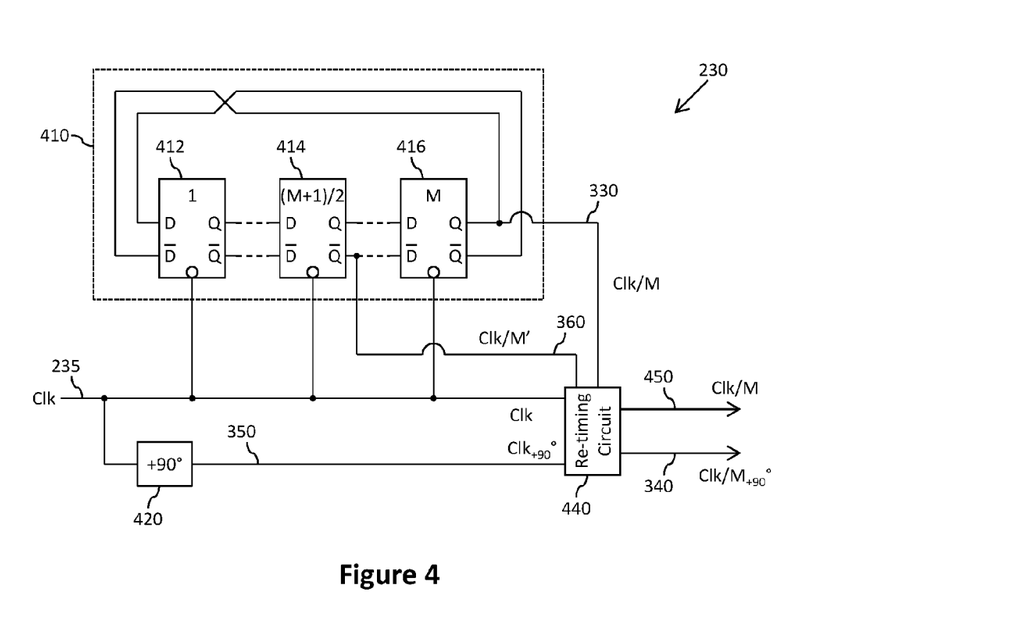
FIG. 4 schematically illustrates a simplified example of a part of a synthesizer module.

FIG. 4 schematically illustrates a simplified example of a part of such a synthesizer module that may be used to implement the synthesizer module 230 of FIG. 2 adapted in accordance with example embodiments of the present invention. The synthesizer module 230 comprises an odd-numbered frequency divider circuit 410 arranged to receive a reference timing signal, such as the reference timing signal 235 illustrated in FIG. 3, and to output one or more frequency-divided signals 330, 360 having a frequency equal to 1/M times the frequency of the reference timing signal 235, where M is an odd-numbered integer.

In the example illustrated in FIG. 4, the odd-numbered frequency divider circuit 410 comprises M flip-flops 412, 414, 416 coupled in a loop whereby the outputs of each flip-flop 412, 414, 416 are coupled to respective inputs of the next flip-flop in the loop, with the exception of the $M^{th}$ flip-flop 416 whose outputs are inversely coupled to the inputs of the first flip-flop 412 such that the non-inverted output of the $M^{th}$ flip-flop 416 is coupled to the inverted input of the first flip-flop 412 whilst the inverted output of the $M^{th}$ flip-flop 416 is coupled to the non-inverted input of the first flip-flop 412. The reference timing signal 235 is provided to the clock inputs of each of the flip-flops 412, 414, 416. In this manner, a state transition resulting from the inverse coupling of the $M^{th}$ flip-flop 416 to the first flip-flop 412 is shifted along the flip-frequency divider circuit 410 by one flip-flop each clock cycle. As a result, each flip-flop output generates an oscillating signal having a frequency equal to 1/M times the frequency of the reference timing signal 235, with the respective signal being phase-shifted relative to the signal of the preceding flip-flop by 180°/M.

The synthesizer module 230 of FIG. 4 further comprises a 90° phase-shift component 420 arranged to receive the reference timing signal 235 and to output a 90° phase-shifted form of the reference timing signal 350.

The synthesizer module 230 further comprises a re-timing circuit 440 arranged to receive the frequency-divided signal 330, 360 output by the odd-numbered frequency divider circuit 410 and the 90° phase-shifted form of the reference timing signal 350, and to re-time transitions of at least one of the frequency-divided signals 330, 360 to the 90° phase-shifted form of the reference timing signal 350 to generate one or more timing signals having a frequency equal to 1/M times the frequency of the reference timing signal and comprising the re-timed transitions of the at least one frequency-divided signal 330, 360, such as described in greater detail below. In the example illustrated in FIG. 4, the synthesizer module 230 is arranged to generate a first timing signal 450 and a further timing signal 340, at least one of which comprising the re-timed transitions of the at least one frequency-divided signal 330, 360.

In the illustrated example of FIG. 4, the odd-numbered frequency divider circuit 410 is arranged to output a first frequency-divided signal 330 having a frequency equal to 1/M times the frequency of the reference timing signal. The re-timing circuit 440 is arranged to receive the first frequency-divided signal 330 and to generate the first timing signal 450 comprising transitions corresponding to transitions within the first frequency-divided signal 330.

The odd-numbered frequency divider circuit 410 is further arranged to output a second frequency-divided signal 360 having a frequency equal to 1/M times the frequency of the reference timing signal and phase-shifted by $\Phi$ with respect to the first frequency-divided signal 330.

In the illustrated example, the first frequency-divided signal 330 is output by the non-inverted output of the $M^{th}$ flip-flop 416 of the odd-numbered frequency divider circuit 410 and the second frequency-divided signal 360 is output by the inverted output of the $((M+1)/2)^{th}$ flip-flop 414 of the odd-numbered frequency divider circuit 410. Accordingly, the second frequency-divided signal 360 is phase-shifted by $\Phi=((M+1)/2)*(360°/M)-180°$ with respect to the first frequency-divided signal 330. Thus, in the case where the odd-numbered frequency divider circuit 410 comprises a ⅓ frequency divider circuit (i.e. where M=3), the $M^{th}$ flip-flop 416 comprises the $3^{rd}$ flip-flop 416 in the frequency divider circuit 410 and the $((M+1)/2)^{th}$ flip-flop 414 comprises the $2^{nd}$ flip-flop 414 in the frequency divider circuit 410. Accordingly, the first and second frequency-divided signals 330, 360 are phase-shifted relative to one another by $\Phi=(2*360°/3)-180°=60°$, as illustrated in FIG. 3.

In the example illustrated in FIG. 4, the re-timing circuit 440 is arranged to receive the second frequency-divided signal 360 and to generate the further timing signal 340 by re-timing a set of transitions (e.g. comprising leading and/or trailing transitions) of the second frequency-divided signal 360 to be temporally aligned to transitions of the 90° phase-shifted form of the reference timing signal 350 such that the corresponding set of transitions of the further timing signal 340 are phase shifted by $\Delta$ with respect to the respective transitions of the second frequency-shifted signal 360, where $\Delta=90°-\Phi$. In this manner, the transitions of the further timing signal 340 synchronised to the 90° phase-shifted form of the reference timing signal 350 are phase shifted by 90° with respect to the corresponding transitions of the first timing signal 450.

In particular, the re-timing circuit 440 illustrated in FIG. 4 is arranged to re-time the transitions of the second frequency-divided signal 360 to be temporally aligned to transitions of the 90° phase-shifted form of the reference timing signal 350 such that the transitions of the second frequency-divided signal 360 are delayed by a quarter of a cycle of the reference timing signal 235, thereby introducing a phase shift $\Delta$ equal to 90°/M (i.e. 30° in the case where M=3) to the transitions of the second frequency-divided signal 360. Notably, as described above, the second frequency-divided signal 360 is phase-shifted by (i.e. 60° in the case where M=3) with respect to the first frequency-divided signal 330. Accordingly, re-timing the transitions of the second frequency-divided signal 360 to be temporally aligned to transitions of the 90° phase-shifted form of the reference timing signal 350 results in the generated timing signal 340 being phase-shifted with respect to the first frequency-divided signal 330 (and thus the first timing signal 450) by $\Phi+\Delta=90°$.

Frequency-divided signals generated by frequency divider circuits are prone to high levels of phase noise. Advantageously, the re-timing of the transitions of the second frequency-divided signal 360 to be temporally aligned to transitions of the 90° phase-shifted form of the reference timing signal 350 by the re-timing circuit 440 provides the additional benefit of generating the further phase-shifted frequency-divided signal 340 whilst at the same time substantially removing phase noise from the odd-numbered frequency divider circuit 410.

In the example illustrated in FIG. 4, the re-timing circuit 440 is further arranged to receive the reference timing signal 235 and to re-time the transitions of the first frequency-divided signal 330 to be temporally aligned to transitions of the (non-phase-shifted) reference timing signal 235 to generate a 'clean' frequency-divided signal 450, i.e. phase noise from the odd-numbered frequency-divided circuit 410 substantially removed, and having a frequency and phase substantially matching the first frequency-divided signal 330 output by the odd-numbered frequency divider circuit 410.

In accordance with some example embodiments, the re-timing circuit 440 of FIG. 4 is arranged to re-time leading and trailing transitions of the second frequency-divided signal 360 to be temporally aligned to transitions of the 90° phase-shifted form of the reference timing signal 350 to generate the further timing signal 340 such that the leading transitions and the trailing transitions of the further timing signal 340 are phase shifted by 90° with respect to leading transitions and trailing transitions of the first timing signal 450. In this manner, the synthesizer module 230 may be arranged to generate the first timing signal 450 and the further timing signal 340 comprising 50% duty cycles, and 90° phase-shifted with respect to one another.

Figure 5:
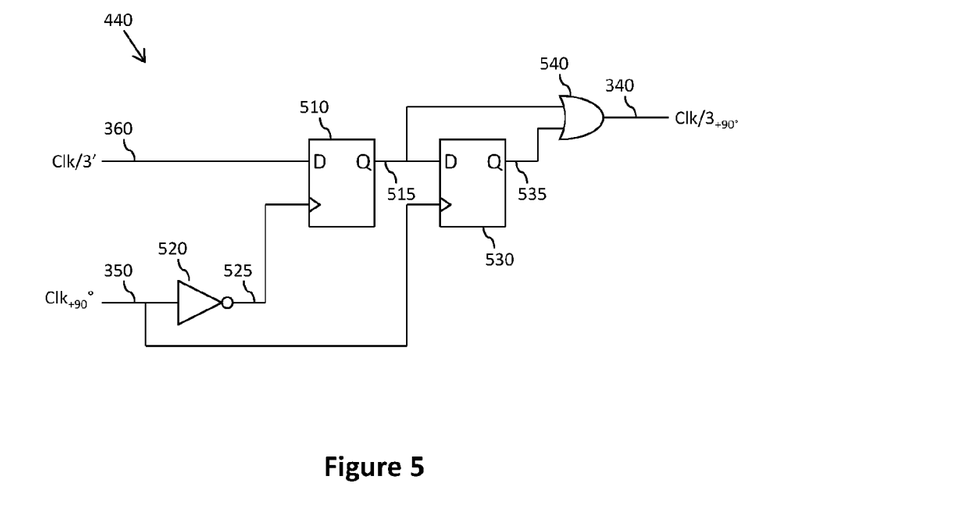
FIG. 5 illustrates a simplified circuit diagram of an example of a part of a re-timing circuit.

FIG. 5 illustrates a simplified circuit diagram of an example of a part of the re-timing circuit 440 arranged to generate the further phase-shifted frequency-divided signal 340.

The re-timing circuit 440 comprises a first latch component 510 arranged to receive at a data input thereof the second frequency-divided signal 360. The first latch component 510 is further arranged to receive at a clock input thereof an inverted form 525 of the 90° phase-shifted form of the reference timing signal 350, produced by an inverter 520. In the manner, the first latch component 510 is arranged to sample and output the second frequency-divided signal 360 synchronously with the inverted form of the 90° phase-shifted form of the reference timing signal 525.

The output signal 515 of the first latch component 510 is provided to a data input of a second latch component 530. The second latch component 530 is further arranged to receive at a clock input thereof the 90° phase-shifted form of the reference timing signal 350. In the manner, the second latch component 530 is arranged to sample and output the output signal 515 of the first latch component 510 synchronously with the (non-inverted) 90° phase-shifted form of the reference timing signal 350.

Figure 6:
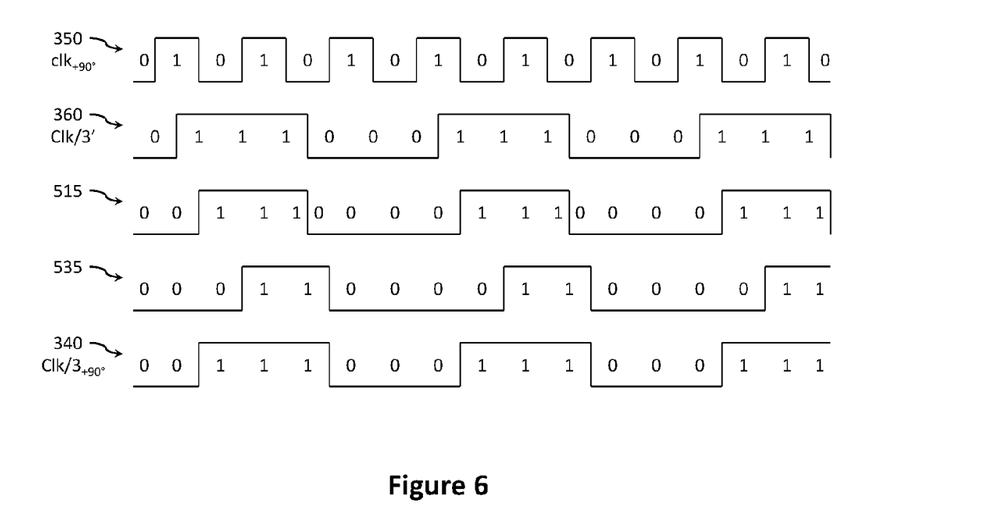
FIG. 6 illustrates a timing diagram illustrating the timing of signals within the example re-timing circuit illustrated in FIG. 5.

An OR gate 540 is arranged to receive at inputs thereof the output signals 515, 535 of the first and second latch components 510, 530. The OR gate 540 outputs the further phase-shifted frequency-divided signal 340. FIG. 6 illustrates a timing diagram illustrating the timing of signals within the example re-timing circuit 440 illustrated in FIG. 5.

Figure 7:
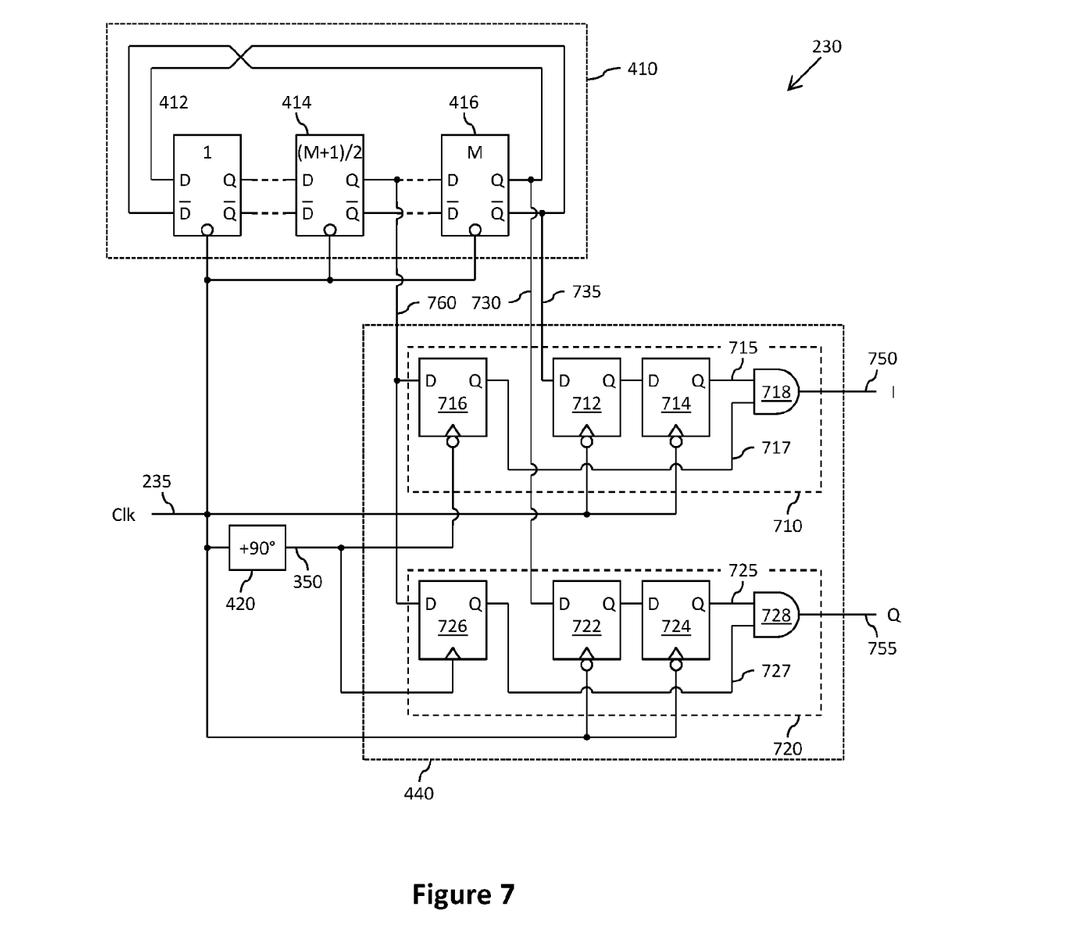
FIG. 7 schematically illustrates an alternative example of a part of a synthesizer module.
Figure 8:
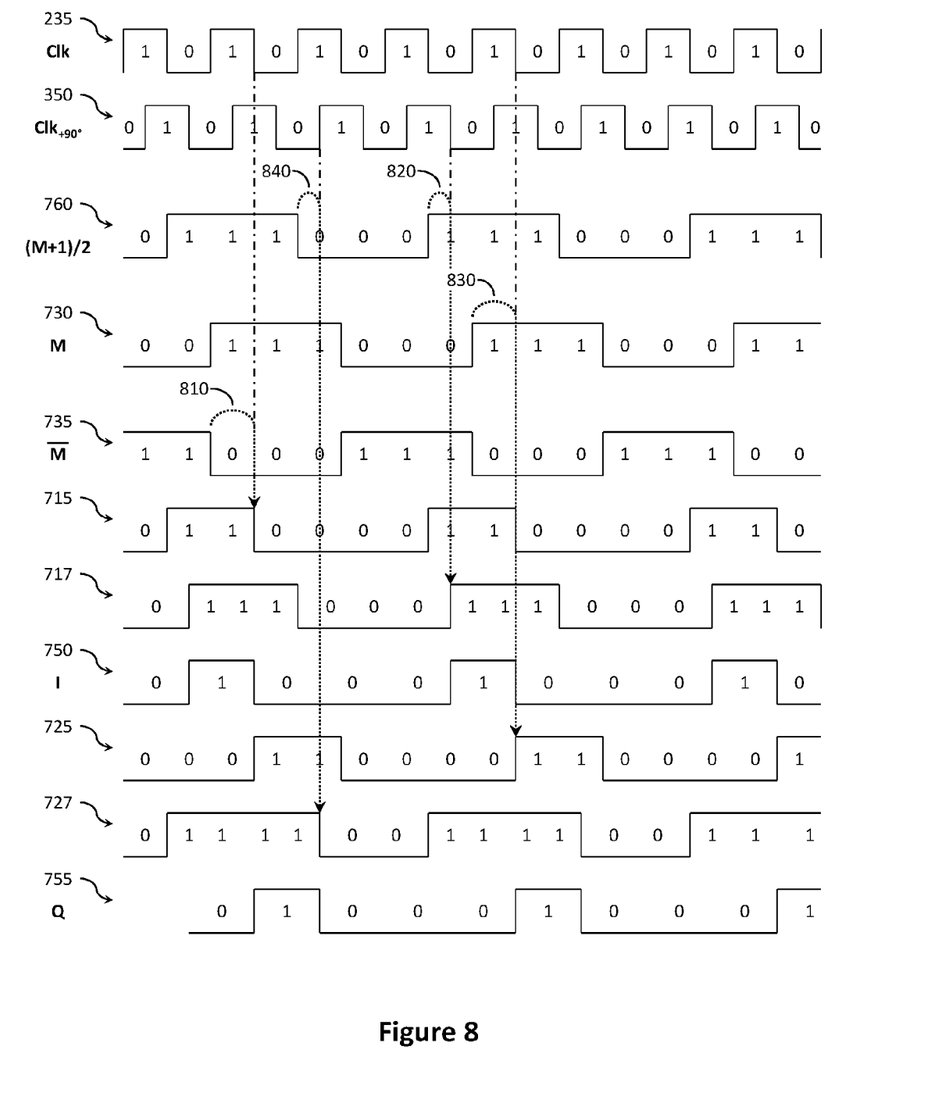
FIG. 8 illustrates a timing diagram showing various signals within the synthesizer circuit of FIG. 7.

FIG. 7 schematically illustrates an alternative example of a part of a synthesizer module that may be used to implement the synthesizer module 230 of FIG. 2. The synthesizer module 230 comprises an odd-numbered frequency divider circuit 410 arranged to receive a reference timing signal 235, and to output one or more frequency-divided signals 730, 735, 760 having a frequency equal to 1/M times the frequency of the reference timing signal 235, where M is an odd-numbered integer. FIG. 8 illustrates a timing diagram for various signals within the synthesizer circuit of FIG. 7.

In the example illustrated in FIG. 7, the odd-numbered frequency divider circuit 410 comprises M flip-flops 412, 414, 416 coupled in a loop whereby the outputs of each flip-flop 412, 414, 416 are coupled to respective inputs of the next flip-flop in the loop, with the exception of the $M^{th}$ flip-flop 416 whose outputs are inversely coupled to the inputs of the first flip-flop 412 such that the non-inverted output of the $M^{th}$ flip-flop 416 is coupled to the inverted input of the first flip-flop 412 whilst the inverted output of the $M^{th}$ flip-flop 416 is coupled to the non-inverted input of the first flip-flop 412. The reference timing signal 235 is provided to the clock inputs of each of the flip-flops 412, 414, 416. In this manner, a state transition resulting from the inverse coupling of the $M^{th}$ flip-flop 416 to the first flip-flop 412 is shifted along the flip-frequency divider circuit 410 by one flip-flop each clock cycle. As a result, each flip-flop output generates an oscillating signal having a frequency equal to 1/M times the frequency of the reference timing signal 235, with the respective signal being phase-shifted relative to the signal of the preceding flip-flop by 180°/M.

The synthesizer module 230 of FIG. 7 further comprises a 90° phase-shift component 420 arranged to receive the reference timing signal 235 and to output a 90° phase-shifted form of the reference timing signal 350.

The synthesizer module 230 further comprises a re-timing circuit 440 arranged to receive the frequency-divided signals 730, 735, 760 output by the odd-numbered frequency divider circuit 410 and the 90° phase-shifted form of the reference timing signal 350, and to re-time transitions of the frequency-divided signals 730, 735, 760 to the 90° phase-shifted form of the reference timing signal 350 to generate one or more timing signals having a frequency equal to 1/M times the frequency of the reference timing signal and comprising the re-timed transitions of the frequency-divided signals 730, 735, 760. In the example illustrated in FIG. 7, the synthesizer module 230 is arranged to generate a first timing signal 750 and a second timing signal 755, at least one of which comprising the re-timed transitions of the at least one frequency-divided signal 730, 735, 760. Specifically for the example illustrated in FIG. 7, the synthesizer module 230 is arranged to generate quadrature (I/Q) timing signals 750, 755. Accordingly, and as described in greater detail below, the synthesizer module 230 is arranged to generate the first and second timing signals 750, 755 to be 90° phase-shifted with respect to one another and comprising a 25% duty cycle.

In the illustrated example of FIG. 7, the odd-numbered frequency divider circuit 410 is arranged to output a pair of complementary frequency-divided signals 730, 735 having a frequency equal to 1/M times the frequency of the reference timing signal. The complementary frequency-divided signals 730, 735 may be considered to comprise a non-inverted frequency-divided signal 730 and an inverted frequency-divided signal 735 180° phase-shifted relative to one another. The odd-numbered frequency divider circuit 410 is further arranged to output a further frequency-divided signal 760 having a frequency equal to 1/M times the frequency of the reference timing signal and phase-shifted by Φ with respect to the non-inverted signal 730 of the pair of complementary frequency-divided signals.

In the illustrated example, the pair of complementary frequency-divided signals 730, 735 are output by the non-inverted and inverted outputs respectively of the $M^{th}$ flip-flop 416 of the odd-numbered frequency divider circuit 410 and the further frequency-divided signal 760 is output by the non-inverted output of the $((M+1)/2)^{th}$ flip-flop 414 of the odd-numbered frequency divider circuit 410. Accordingly, the non-inverted signal 730 of the pair of complementary frequency-divided signals is phase-shifted by $\Phi=((M-1)/2)*(180°/M)$ with respect to the further frequency-divided signal 760. Thus, in the case where the odd-numbered frequency divider circuit 410 comprises a ⅓ frequency divider circuit (i.e. where M=3), the $M^{th}$ flip-flop 416 comprises the $3^{rd}$ flip-flop in the frequency divider circuit 410 and the $((M+1)/2)^{th}$ flip-flop 414 comprises the $2^{nd}$ flip-flop in the frequency divider circuit 410. Accordingly, the non-inverted signal 730 of the pair of complementary frequency-divided signals is phase-shifted by $\Phi=((2/2)*(180°/3))=60°$ with respect to the further frequency-divided signal 760.

In the example illustrated in FIG. 7, the re-timing circuit 440 comprises a first re-timing component 710 arranged to generate the first (I) timing signal 750 and a second re-timing component 720 arranged to generate the second (Q) timing signal 755.

In the illustrated example, the first re-timing component 710 of the re-timing circuit 440 is arranged to receive the inverted signal 735 of the pair of complementary frequency-divided signals and the reference timing signal 235, and to re-time the transitions of the received frequency-divided signal 735 to be temporally aligned to transitions of the reference timing signal 235 to generate a first re-timed signal 715. The first re-timing component 710 of the re-timing circuit 440 is further arranged to receive the further frequency-divided signal 760 and the 90° phase-shifted reference timing signal 350, and to re-time the transitions of the further frequency-divided signal 760 to be temporally aligned to transitions of the 90° phase-shifted reference timing signal 350 to generate a second re-timed signal 717. The first (I) timing signal 750 is then generated from the first and second re-timed signals 715, 717.

In particular for the illustrated example of FIG. 7, the first re-timing component 710 comprises a first latch 712 arranged to receive at a data input thereof the inverted signal 735 of the pair of complementary frequency-divided signals. The first re-timing component 710 further comprises a second latch 714 arranged to receive at a data input thereof the output signal from the first latch 712. The first and second latches 712, 714 are further arranged to receive the reference timing signal 235 at inverting clock inputs thereof. In this manner, the first and second latches 712, 714 form a flip-flop structure arranged to sample and hold the inverted signal 735 of the pair of complementary frequency-divided signals on trailing (falling) edges of the reference timing signal 235, with the output of the flip-flop structure (i.e. the output of the second latch 714) providing the first re-timed signal 715. Accordingly, the flip-flop structure formed by the first and second latches 712, 714 is arranged to re-time the transitions of the inverted signal 735 of the pair of complementary frequency-divided signals to be temporally aligned to trailing (falling) edges of the reference timing signal 235, such as indicated at 810 in FIG. 8, to generate the first re-timed signal 715.

The first re-timing component 710 further comprises a third latch 716 arranged to receive at a data input thereof the further frequency-divided signal 760, and the 90° phase-shifted reference timing signal 350 at an inverting clock input thereof. In this manner, the third latch 716 is arranged to sample and output (as the second re-timed signal 717) the further frequency-divided signal 760 during 'low' phases of the 90° phase-shifted reference timing signal 350. Accordingly, the third latch 716 is arranged to re-time leading (rising) transitions of the further frequency-divided signal 760 to be temporally aligned to trailing (falling) edges of the 90° phase-shifted reference timing signal 350, such as indicated at 820 in FIG. 8.

In the example illustrated in FIG. 7 the first re-timing component 710 further comprises an AND gate 718 arranged to receive at inputs thereof the first and second re-timed signals 715, 717, and to output the first (I) timing signal 750 based on the received first and second re-timed signals 715, 717. Accordingly, and as illustrated in FIG. 8, the resulting first (I) timing signal 750 comprises a frequency equal to ⅓ the frequency of the reference timing signal 235, with a 25% duty cycle.

In the illustrated example, the second re-timing component 720 of the re-timing circuit 440 is arranged to receive the non-inverted signal 730 of the pair of complementary frequency-divided signals and the reference timing signal 235, and to re-time the transitions of the received frequency-divided signal 730 to be temporally aligned to transitions of the reference timing signal 235 to generate a third re-timed signal 725. The second re-timing component 720 of the re-timing circuit 440 is further arranged to receive the further frequency-divided signal 760 and the 90° phase-shifted reference timing signal 350, and to re-time the transitions of the further frequency-divided signal 760 to be temporally aligned to transitions of the 90° phase-shifted reference timing signal 350 to generate a fourth re-timed signal 727. The second (Q) timing signal 755 is then generated from the third and fourth re-timed signals 725, 727.

In particular for the illustrated example of FIG. 7, the second re-timing component 720 comprises a first latch 722 arranged to receive at a data input thereof the non-inverted signal 730 of the pair of complementary frequency-divided signals. The second re-timing component 720 further comprises a second latch 724 arranged to receive at a data input thereof the output signal from the first latch 722. The first and second latches 722, 724 are further arranged to receive the reference timing signal 235 at inverting clock inputs thereof. In this manner, the first and second latches 722, 724 form a flip-flop structure arranged to sample and hold the non-inverted signal 730 of the pair of complementary frequency-divided signals on trailing (falling) edges of the reference timing signal 235, with the output of the flip-flop structure (i.e. the output of the second latch 724) providing the third re-timed signal 725. Accordingly, the flip-flop structure formed by the first and second latches 722, 724 is arranged to re-time the transitions of the non-inverted signal 730 of the pair of complementary frequency-divided signals to be temporally aligned to trailing (falling) edges of the reference timing signal 235, such as indicated at 830 in FIG. 8, to generate the third re-timed signal 725.

The second re-timing component 720 further comprises a third latch 726 arranged to receive at a data input thereof the further frequency-divided signal 760, and the 90° phase-shifted reference timing signal 350 at a non-inverting clock input thereof. In this manner, the third latch 726 is arranged to sample and output (as the second re-timed signal 727) the further frequency-divided signal 760 during 'high' phases of the 90° phase-shifted reference timing signal 350. Accordingly, the third latch 726 is arranged to re-time trailing (falling) transitions of the further frequency-divided signal 760 to be temporally aligned to leading (rising) edges of the 90° phase-shifted reference timing signal 350, such as indicated at 840 in FIG. 8.

In the example illustrated in FIG. 7 the second re-timing component 720 further comprises an AND gate 728 arranged to receive at inputs thereof the third and fourth re-timed signals 725, 727, and to output the second (Q) timing signal 755 based on the received third and fourth re-timed signals 725, 727. Accordingly, and as illustrated in FIG. 8, the resulting second (Q) timing signal 755 comprises a frequency equal to ⅓ the frequency of the reference timing signal 235, with a 25% duty cycle.

Notably, the leading transitions of the first (I) timing signal 750 are temporally aligned to the leading transitions of the second re-timed signal 717, and thus to leading transitions of the further frequency-divided signal 760 re-timed to be temporally aligned to trailing (falling) edges of the 90° phase-shifted reference timing signal 350. Accordingly, and as illustrated in FIG. 8, the leading transitions of the first (I) timing signal 750 are phase-shifted by $\Delta=90°/M$ (i.e. 30° in the case where M=3) with respect to the leading transitions of the further frequency-divided signal 760. Conversely, the leading transitions of the second (Q) timing signal 755 are temporally aligned to the leading transitions of the third re-timed signal 725, and thus to leading transitions of the non-inverted signal 730 of the pair of complementary frequency-divided signals re-timed to be temporally aligned to trailing (falling) edges of the reference timing signal 235. Accordingly, and as illustrated in FIG. 8, the leading transitions of the second (Q) timing signal 750 are phase-shifted by $\Delta=180°/M$ (i.e. 60° in the case where M=3) with respect to the leading transitions of the non-inverted signal 730 of the pair of complementary frequency-divided signals.

As outlined above, the non-inverted signal 730 of the pair of complementary frequency-divided signals is phase-shifted by $\Phi=60°$ with respect to the further frequency-divided signal 760. Accordingly, the leading transitions of the second (Q) timing signal 755 are phase-shifted 60°+30°=90° with respect to the first (I) timing signal 750.

Figure 9:
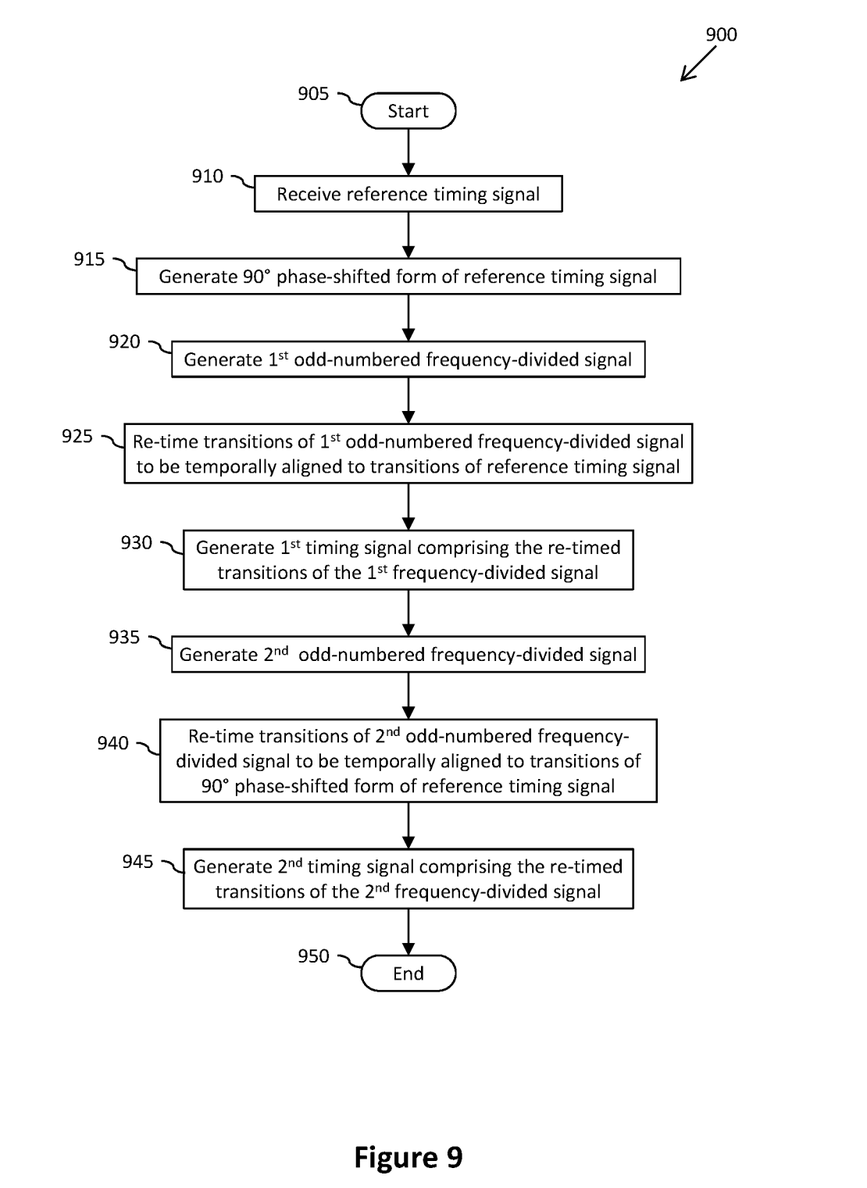
FIG. 9 illustrates a simplified flowchart of a method of generating a timing signal from a reference timing signal.

Referring now to FIG. 9, there is illustrated a simplified flowchart 900 of a method of generating a timing signal from a reference timing signal, such as may be implemented within the synthesizer module 230 illustrated in FIG. 4. The method of FIG. 9 starts at 905, and moves on to 910 where a reference timing signal is received, such as the reference timing signal 235 in FIG. 4. A 90° phase-shifted form of the reference timing signal is generated at 915, such as the 90° phase-shifted reference timing signal 350 in FIG. 4.

A first odd-numbered frequency-divided signal is generated at 920 having a frequency equal to 1/M times the frequency of the reference timing signal, where M is an odd-numbered integer, such as the frequency-divided signal 330 in FIG. 4. A set of transitions of the first frequency-divided signal are re-timed at 925 to be temporally aligned to transitions of the reference timing signal. The set of transitions may include leading and/or trailing transitions of the first frequency-divided signal. A first timing signal is then generated at 930 comprising the re-timed transitions of the first frequency-divided signal, such as the timing signal 450 in FIG. 4.

A second odd-numbered frequency-divided signal is generated at 935, also having a frequency equal to 1/M times the frequency of the reference timing signal, such as the second frequency-divided signal 360 in FIG. 4. A set of transitions of the second frequency-divided signal are re-timed at 940 to be temporally aligned to transitions of the 90° phase-shifted form of the reference timing signal. The set of transitions may include leading and/or trailing transitions of the second frequency-divided signal. A second timing signal is then generated at 945 comprising the re-timed transitions of the second frequency-divided signal, such as the timing signal 340 in FIG. 4.

The method of FIG. 9 then ends at 950.

Figure 10:
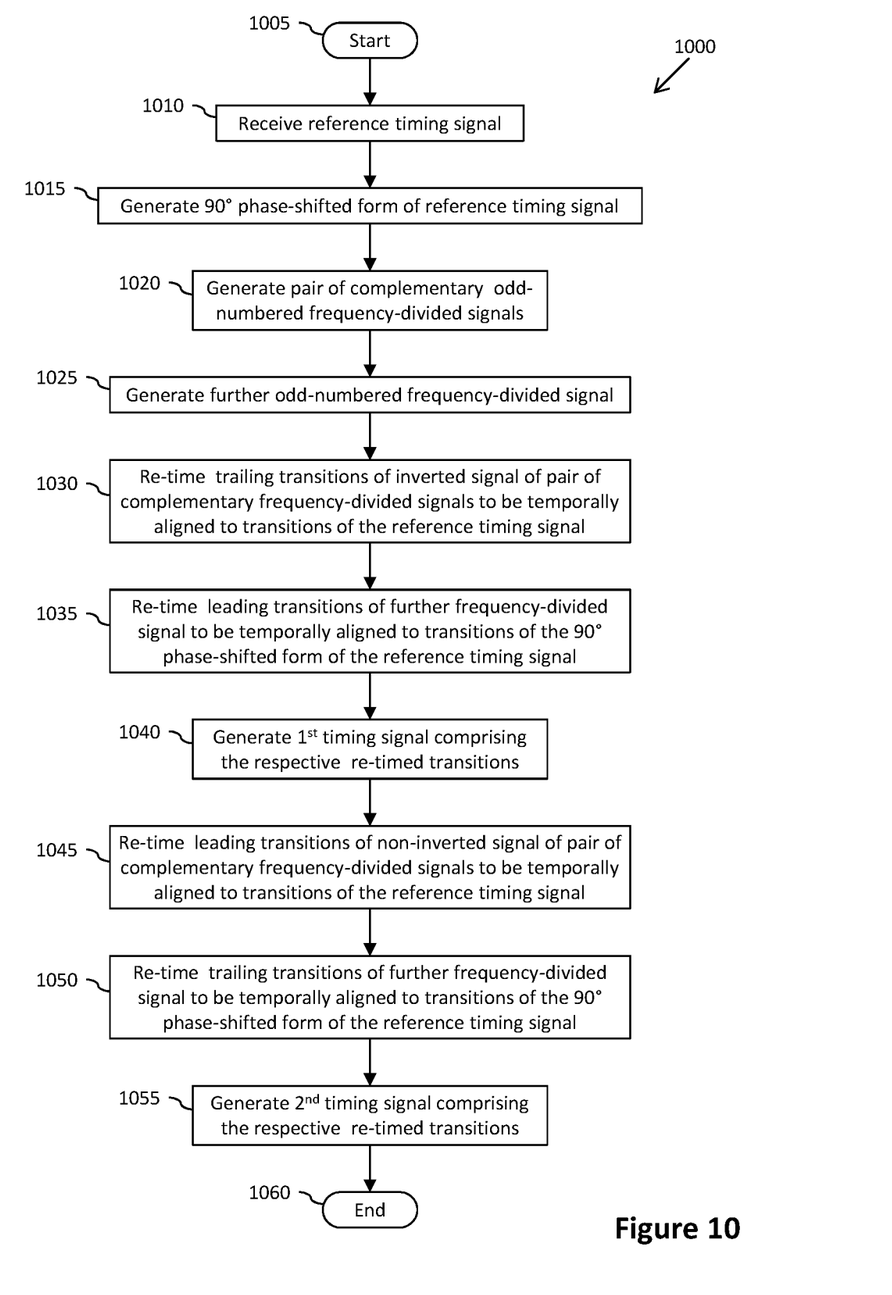
FIG. 10 illustrates a simplified flowchart of a method of generating a timing signal from a reference timing signal.

Referring now to FIG. 10, there is illustrated a simplified flowchart 1000 of a method of generating a timing signal from a reference timing signal, such as may be implemented within the synthesizer module 230 illustrated in FIG. 7. The method of FIG. 10 starts at 1005, and moves on to 1010 where a reference timing signal is received, such as the reference timing signal 235 in FIG. 7. A 90° phase-shifted form of the reference timing signal is generated at 1015, such as the 90° phase-shifted reference timing signal 350 in FIG. 7.

A pair of complementary odd-numbered frequency-divided signals are generated at 1020 having a frequency equal to 1/M times the frequency of the reference timing signal, where M is an odd-numbered integer, such as the pair of complementary frequency-divided signals 730, 735 in FIG. 7. A further odd-numbered frequency-divided signal is generated at 1025, also having a frequency equal to 1/M times the frequency of the reference timing signal, such as the further frequency-divided signal 760 in FIG. 7.

A first set of transitions of an inverted signal of the pair of complementary frequency-divided signals are re-retimed at 1030 to be temporally aligned to transitions of the reference timing signal. In the illustrated example, the first set of transitions in step 1030 comprises trailing transitions of the inverted signal of the pair of complementary frequency-divided signals.

A second set of transitions of the further frequency-divided signal are re-timed at 1035 to be temporally aligned to transitions of the 90° phase-shifted form of the reference timing signal. In the illustrated example, the second set of transitions in step 1035 comprises leading transitions of the further frequency-divided signal.

A first timing signal is then generated at 1040 comprising the re-timed first and second sets of transitions of the frequency-divided signals, such as the timing signal 750 in FIG. 7.

A third set of transitions of a non-inverted signal of the pair of complementary frequency-divided signals are re-retimed at 1045 to be temporally aligned to transitions of the reference timing signal. In the illustrated example, the third set of transitions in step 1045 comprises leading transitions of the non-inverted signal of the pair of complementary frequency-divided signals.

A fourth set of transitions of the further frequency-divided signal are re-timed at 1050 to be temporally aligned to transitions of the 90° phase-shifted form of the reference timing signal. In the illustrated example, the fourth set of transitions in step 1050 comprises trailing transitions of the further frequency-divided signal.

A second timing signal is then generated at 1055 comprising the re-timed third and fourth sets of transitions of the frequency-divided signals, such as the timing signal 755 in FIG. 7.

The method of FIG. 10 then ends, at 1060.

In the example illustrated in FIG. 10 and described above, sets of transitions comprising leading transitions of the respective frequency-divided signals are re-timed at steps 1035 and 1045, and sets of transitions comprising trailing transitions of the respective frequency-divided signals are re-timed at steps 1030 and 1050. However, it will be appreciated that the sets of transitions may alternatively comprise opposing transition types. For example, it is contemplated that sets of transitions comprising trailing transitions of the respective frequency-divided signals may alternatively be re-timed at steps 1035 and 1045, and sets of transitions comprising leading transitions of the respective frequency-divided signals may alternatively be re-timed at steps 1030 and 1050.

In some examples, some or all of the steps illustrated in the flowchart may be implemented in hardware and/or some or all of the steps illustrated in the flowchart may be implemented in software.

Thus, the hereinbefore examples provide a timing signal generation apparatus for use in a synthesizer module. In particular, the hereinbefore examples of apparatus and methods are capable of generating timing signals from odd-numbered frequency divider circuits comprising 90° phase-shifted transitions.

Although some aspects of the invention have been described with reference to their applicability to an RF transceiver, for example a transceiver adapted for use within a UMTS (Universal Mobile Telecommunication System) or LTE (Long Term Evolution) cellular communication system, it will be appreciated that the invention is not limited to use within RF transceivers, any may be implemented within any device or system requiring timing signals.

In particular, it is envisaged that the aforementioned inventive concept can be applied by a semiconductor manufacturer to any integrated circuit comprising a synthesizer or other timing signal generation component. It is further envisaged that, for example, a semiconductor manufacturer may employ the inventive concept in a design of a stand-alone device, such as an application-specific integrated circuit (ASIC) and/or any other sub-system element.

It will be appreciated that, for clarity purposes, the above description has described embodiments of the invention with reference to different functional units. However, it will be apparent that any suitable distribution of functionality between different functional units may be used without detracting from the invention. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved synthesizer module and method of operation therefor have been described, wherein the aforementioned disadvantages with prior art arrangements have been substantially alleviated.

I claim:

1. A synthesizer module arranged to generate at least one timing signal; the synthesizer module comprising:
   at least one odd-numbered frequency divider circuit arranged to receive a reference timing signal and to output at least one frequency-divided signal having a frequency equal to 1/M times the frequency of the reference timing signal, where M is an odd-numbered integer greater than 1;
   a 90° phase-shift circuit arranged to receive the reference timing signal and to output a 90° phase-shifted form of the reference timing signal; and
   a re-timing circuit arranged to:
      receive the at least one frequency-divided signal;
      receive the 90° phase-shifted form of the reference timing signal; and
      re-time a set of transitions of the frequency-divided signal to be temporally aligned to transitions of the 90° phase-shifted form of the reference timing signal to generate the at least one timing signal comprising the re-timed transitions of the frequency-divided signal.

2. The synthesizer module of claim 1, wherein the synthesizer module is arranged to generate a first timing signal and at least one further timing signal wherein:
   the at least one odd-numbered frequency divider circuit is arranged to output a first frequency-divided signal having a frequency equal to 1/M times the frequency of the reference timing signal, and the synthesizer module is arranged to generate the first timing signal based at least partly on transitions within the first frequency-divided signal;
   the at least one odd-numbered frequency divider circuit is further arranged to output a second frequency-divided signal having a frequency equal to 1/M times the frequency of the reference timing signal and phase-shifted with respect to the first frequency-divided signal; and
   the re-timing circuit is arranged to receive the second frequency-divided signal and to re-time a set of transitions of the second frequency-divided signal to be temporally aligned to transitions of the 90° phase-shifted form of the reference timing signal, and to generate the at least one further timing signal comprising the re-timed transitions of the second frequency-divided signal temporally aligned to transitions of the 90° phase-shifted form of the reference timing signal.

3. The synthesizer module of claim 2, wherein:
   the at least one odd-numbered frequency divider circuit is further arranged to output the second frequency-divided signal phase-shifted by an amount Φ with respect to the first frequency-divided signal; and
   the re-timing circuit is arranged to re-time the set of transitions of the second frequency-divided signal to be temporally aligned to transitions of the 90° phase-shifted form of the reference timing signal such that the set of transitions of the at least one further timing signal are phase shifted by an amount Δ with respect to the set of transitions of the second frequency-shifted signal, where Δ=90°−Φ such that the set of transitions of the at least one further timing signal are phase shifted by 90° with respect to the set of transitions of the first timing signal.

4. The synthesizer module of claim 2, wherein the re-timing circuit is arranged to re-time leading transitions and trailing transitions of the second frequency-divided signal to be temporally aligned to transitions of the 90° phase-shifted form of the reference timing signal to generate the at least one further timing signal such that the leading transitions and the trailing transitions of the at least one further timing signal are phase shifted by 90° with respect to leading transitions and trailing transitions of the first timing signal.

5. The synthesizer module of claim 1, wherein the synthesizer module is arranged to generate a first timing signal and at least one further timing signal wherein the re-timing circuit is arranged to:
   receive the at least one frequency-divided signal output by the odd-numbered frequency divider circuit;
   receive the reference timing signal;
   receive the 90° phase-shifted form of the reference timing signal;
   re-time a first set of transitions of the at least one frequency-divided signal to be temporally aligned to transitions of the reference timing signal and re-time a second set of transitions of the at least one frequency-divided signal to be temporally aligned to transitions of the 90° phase-shifted form of the reference timing signal to generate the first timing signal; and
   re-time a third set of transitions of the at least one frequency-divided signal to be temporally aligned to transitions of the reference timing signal and re-time a fourth set of transitions of the at least one frequency-divided signal to be temporally aligned to transitions of the 90° phase-shifted form of the reference timing signal to generate the at least one further timing signal.

6. The synthesizer module of claim 5, wherein the re-timing circuit comprises:
   a first re-timing section arranged to:
      receive a first frequency-divided signal;
      receive a second frequency-divided signal;
      re-time transitions of the first frequency-divided signal to be temporally aligned to transitions of the reference timing signal;
      re-time transitions of the second frequency-divided signal to be temporally aligned to transitions of the 90° phase-shifted form of the reference timing signal; and generate the first timing signal comprising the re-timed transitions of the first and second frequency-divided signals, and a second re-timing section arranged to:
receive an inverted form of the first frequency-divided signal;
receive the second frequency-divided signal;
re-time transitions of the inverted form of the first frequency-divided signal to be temporally aligned to transitions of the 90° phase-shifted form of the reference timing signal;
re-time transitions of the second frequency-divided signal to be temporally aligned to transitions of the reference timing signal; and
generate the at least one further timing signal comprising the re-timed transitions of the inverted form of the first frequency-divided signal and the second frequency-divided signal.

7. The synthesizer module of claim 6, wherein:
the re-timing circuit is arranged to receive a pair of complementary frequency-divided signals and a further frequency-divided signal output by the odd-numbered frequency divider circuit;
the first re-timing section of the re-timing circuit is arranged to:
re-time trailing transitions of an inverted signal of the pair of complementary frequency-divided signals to be temporally aligned to transitions of the reference timing signal;
re-time leading transitions of the further frequency-divided signal to be temporally aligned to transitions of the 90° phase-shifted form of the reference timing signal; and
generate the first timing signal comprising the re-timed transitions of the respective frequency-divided signals; and
the second re-timing section of the re-timing circuit is arranged to:
re-time leading transitions of a non-inverted signal of the pair of complementary frequency-divided signals to be temporally aligned to transitions of the reference timing signal;
re-time trailing transitions of the further frequency divided signal to be temporally aligned to transitions of the 90° phase-shifted form of the reference timing signal; and
generate the at least one further timing signal comprising the re-timed transitions of the respective frequency-divided signals.

8. The synthesizer module of claim 7, wherein:
the first re-timing section of the re-timing circuit is arranged to generate the first timing signal comprising a frequency equal to 1/M times the frequency of the reference timing signal with a 25% duty cycle; and
the second re-timing section of the re-timing circuit is arranged to generate the at least one further timing signal comprising a frequency equal to 1/M times the frequency of the reference timing signal with a 25% duty cycle, and phase-shifted by 90° with respect to the first timing signal.

9. A radio frequency transceiver module comprising at least one synthesizer module arranged to generate at least one timing signal; the at least one synthesizer module comprising:
at least one odd-numbered frequency divider circuit arranged to receive a reference timing signal and to output at least one frequency-divided signal having a frequency equal to 1/M times the frequency of the reference timing signal, where M is an odd-numbered integer greater than 1;
a 90° phase-shift circuit arranged to receive the reference timing signal and to output a 90° phase-shifted form of the reference timing signal; and
a re-timing circuit arranged to:
receive the at least one frequency-divided signal;
receive the 90° phase-shifted form of the reference timing signal; and
re-time a set of transitions of the frequency-divided signal to be temporally aligned to transitions of the 90° phase-shifted form of the reference timing signal to generate the at least one timing signal comprising the re-timed transitions of the frequency-divided signal.

10. The radio frequency transceiver module of claim 9, wherein the at least one synthesizer module is arranged to generate a first timing signal and at least one further timing signal wherein:
the at least one odd-numbered frequency divider circuit is arranged to output a first frequency-divided signal having a frequency equal to 1/M times the frequency of the reference timing signal, and the at least one synthesizer module is arranged to generate the first timing signal based at least partly on transitions within the first frequency-divided signal;
the at least one odd-numbered frequency divider circuit is further arranged to output a second frequency-divided signal having a frequency equal to 1/M times the frequency of the reference timing signal and phase-shifted with respect to the first frequency-divided signal; and
the re-timing circuit is arranged to receive the second frequency-divided signal and to re-time a set of transitions of the second frequency-divided signal to be temporally aligned to transitions of the 90° phase-shifted form of the reference timing signal, and to generate the at least one further timing signal comprising the re-timed transitions of the second frequency-divided signal temporally aligned to transitions of the 90° phase-shifted form of the reference timing signal.

11. The radio frequency transceiver module of claim 10, wherein:
the at least one odd-numbered frequency divider circuit is further arranged to output the second frequency-divided signal phase-shifted by an amount $\Phi$ with respect to the first frequency-divided signal; and
the re-timing circuit is arranged to re-time the set of transitions of the second frequency-divided signal to be temporally aligned to transitions of the 90° phase-shifted form of the reference timing signal such that the set of transitions of the at least one further timing signal are phase shifted by an amount $\Delta$ with respect to the set of transitions of the second frequency-shifted signal, where $\Delta=90°-\Phi$ such that the set of transitions of the at least one further timing signal are phase shifted by 90° with respect to the set of transitions of the first timing signal.

12. The radio frequency transceiver module of claim 10, wherein the re-timing circuit is arranged to re-time leading transitions and trailing transitions of the second frequency-divided signal to be temporally aligned to transitions of the 90° phase-shifted form of the reference timing signal to generate the at least one further timing signal such that the leading transitions and the trailing transitions of the at least one further timing signal are phase shifted by 90° with respect to leading transitions and trailing transitions of the first timing signal.

13. The radio frequency transceiver module of claim 9, wherein the at least one synthesizer module is arranged to generate a first timing signal and at least one further timing signal wherein the re-timing circuit is arranged to:
receive the at least one frequency-divided signal output by the odd-numbered frequency divider circuit;
receive the reference timing signal;
receive the 90° phase-shifted form of the reference timing signal;
re-time a first set of transitions of the at least one frequency-divided signal to be temporally aligned to transitions of the reference timing signal and re-time a second set of transitions of the at least one frequency-divided signal to be temporally aligned to transitions of the 90° phase-shifted form of the reference timing signal to generate the first timing signal; and
re-time a third set of transitions of the at least one frequency-divided signal to be temporally aligned to transitions of the reference timing signal and re-time a fourth set of transitions of the at least one frequency-divided signal to be temporally aligned to transitions of the 90° phase-shifted form of the reference timing signal to generate the at least further timing signal.

14. The radio frequency transceiver module of claim 13, wherein the re-timing circuit comprises:
a first re-timing section arranged to:
receive a first frequency-divided signal;
receive a second frequency-divided signal;
re-time transitions of the first frequency-divided signal to be temporally aligned to transitions of the reference timing signal;
re-time transitions of the second frequency-divided signal to be temporally aligned to transitions of the 90° phase-shifted form of the reference timing signal; and
generate the first timing signal comprising the re-timed transitions of the first and second frequency-divided signals, and
a second re-timing section arranged to:
receive an inverted form of the first frequency-divided signal;
receive the second frequency-divided signal;
re-time transitions of the inverted form of the first frequency-divided signal to be temporally aligned to transitions of the 90° phase-shifted form of the reference timing signal;
re-time transitions of the second frequency-divided signal to be temporally aligned to transitions of the reference timing signal; and
generate the at least one further timing signal comprising the re-timed transitions of the inverted form of the first frequency-divided signal and the second frequency-divided signal.

15. The radio frequency transceiver module of claim 14, wherein:
the re-timing circuit is arranged to receive a pair of complementary frequency-divided signals and a further frequency-divided signal output by the odd-numbered frequency divider circuit;
the first re-timing section of the re-timing circuit is arranged to:

re-time trailing transitions of an inverted signal of the pair of complementary frequency-divided signals to be temporally aligned to transitions of the reference timing signal;
re-time leading transitions of the further frequency-divided signal to be temporally aligned to transitions of the 90° phase-shifted form of the reference timing signal; and
generate the first timing signal comprising the re-timed transitions of the respective frequency-divided signals; and
the second re-timing section of the re-timing circuit is arranged to:
re-time leading transitions of a non-inverted signal of the pair of complementary frequency-divided signals to be temporally aligned to transitions of the reference timing signal;
re-time trailing transitions of the further frequency divided signal to be temporally aligned to transitions of the 90° phase-shifted form of the reference timing signal; and
generate the at least one further timing signal comprising the re-timed transitions of the respective frequency-divided signals.

16. The radio frequency transceiver module of claim 15, wherein:
the first re-timing section of the re-timing circuit is arranged to generate the first timing signal comprising a frequency equal to 1/M times the frequency of the reference timing signal with a 25% duty cycle; and
the second re-timing section of the re-timing circuit is arranged to generate the at least one further timing signal comprising a frequency equal to 1/M times the frequency of the reference timing signal with a 25% duty cycle, and phase-shifted by 90° with respect to the first timing signal.

17. A method of generating a timing signal from a reference timing signal; the method comprising:
generating a 90° phase-shifted form of the reference timing signal;
generating at least one frequency-divided signal having a frequency equal to 1/M times the frequency of the reference timing signal, where M is an odd-numbered integer greater than 1; and
re-timing a set of transitions of the frequency-divided signal to be temporally aligned to transitions of the 90° phase-shifted form of the reference timing signal to generate the timing signal comprising the re-timed transitions of the frequency-divided signal.

18. The method of claim 17, wherein the method comprises:
generating a first frequency-divided signal having a frequency equal to 1/M times the frequency of the reference timing signal;
re-timing a set of transitions of the first frequency-divided signal to be temporally aligned to transitions of the reference timing signal;
generating a first timing signal comprising the re-timed transitions of the first frequency-divided signal temporally aligned to transitions of the reference timing signal;
generating a second frequency-divided signal having a frequency equal to 1/M times the frequency of the reference timing signal and phase-shifted with respect to the first frequency-divided signal;

re-timing a set of transitions of the second frequency-divided signal to be temporally aligned to transitions of the 90° phase-shifted form of the reference timing signal; and generating at least one further timing signal comprising the re-timed transitions of the second frequency-divided signal temporally aligned to transitions of the 90° phase-shifted form of the reference timing signal.

19. The method of claim 18, wherein the method comprises:

generating a pair of complementary frequency-divided signals;

generating a further frequency-divided signal;

re-timing trailing transitions of an inverted signal of the pair of complementary frequency-divided signals to be temporally aligned to transitions of the reference timing signal;

re-timing leading transitions of the further frequency-divided signal to be temporally aligned to transitions of the 90° phase-shifted form of the reference timing signal;

generating the first timing signal comprising the re-timed transitions of the respective frequency-divided signals;

re-timing leading transitions of a non-inverted signal of the pair of complementary frequency-divided signals to be temporally aligned to transitions of the reference timing signal;

re-timing trailing transitions of the further frequency divided signal to be temporally aligned to transitions of the 90° phase-shifted form of the reference timing signal; and generating the at least one further timing signal comprising the re-timed transitions of the respective frequency-divided signals.

20. The method of claim 19, wherein the method comprises:

generating the first timing signal comprising a frequency equal to 1/M times the frequency of the reference timing signal with a 25% duty cycle; and generating the at least one further timing signal comprising a frequency equal to 1/M times the frequency of the reference timing signal with a 25% duty cycle, and phase-shifted by 90° with respect to the first timing signal.

* * * * *